United States Patent [19]

Mullarkey et al.

[11] Patent Number: 5,732,033
[45] Date of Patent: Mar. 24, 1998

[54] METHOD AND CIRCUIT FOR RAPIDLY EQUILIBRATING PAIRED DIGIT LINES OF A MEMORY DEVICE DURING TESTING

[75] Inventors: Patrick J. Mullarkey, Meridian; Casey R. Kurth, Boise, both of Id.

[73] Assignee: Micron Technology, Inc., Boise, Id.

[21] Appl. No.: 749,003

[22] Filed: Nov. 14, 1996

[51] Int. Cl.$^6$ ............................................. G11C 7/00
[52] U.S. Cl. ................ 365/201; 365/200; 365/230.6
[58] Field of Search .................................. 365/201, 149, 365/230.06, 200

[56] References Cited

U.S. PATENT DOCUMENTS

| | | | |
|---|---|---|---|
| 4,942,556 | 7/1990 | Sasaki et al. | 365/200 |
| 5,060,230 | 10/1991 | Arimoto et al. | 371/21.2 |
| 5,132,575 | 7/1992 | Chern | 307/530 |
| 5,157,629 | 10/1992 | Sato et al. | 365/201 |
| 5,184,327 | 2/1993 | Matsuda et al. | 365/201 |
| 5,302,870 | 4/1994 | Chern | 307/530 |
| 5,633,826 | 5/1997 | Tsukada | 365/200 |
| 5,648,934 | 7/1997 | O'Toole | 365/200 |
| 5,652,725 | 7/1997 | Suma et al. | 365/200 |

*Primary Examiner*—David C. Nelms
*Assistant Examiner*—Hien Nguyen
*Attorney, Agent, or Firm*—Schwegman, Lundberg, Woessner & Kluth P.A.

[57] ABSTRACT

A method and circuit for rapidly equilibrating paired digit lines of the memory array of a dynamic random access memory device during testing of the memory device includes a plurality of pass gates which are used to connect the equilibrating voltage directly to the paired digit lines, bypassing the conventional equilibration circuitry of the memory device. The pass gates used are contained in spare rows of the memory array and are fabricated as part of the memory device. The pass gates are enabled by activating the row lines for the spare rows while the memory device is being operated in a test mode.

17 Claims, 5 Drawing Sheets

METHOD AND CIRCUIT FOR RAPIDLY EQUILIBRATING PAIRED DIGIT LINES OF A MEMORY DEVICE DURING TESTING

FIELD OF THE INVENTION

The present invention relates to testing of semiconductor memory devices, such as dynamic random access memory devices, and in particular, the invention relates to a method and circuit for rapidly equilibrating paired digit lines of a memory array of a semiconductor memory device during testing using spare rows of the memory array.

BACKGROUND OF THE INVENTION

Semiconductor memory devices, such as dynamic random access memory (DRAM) devices, undergo a tremendous amount of testing at various steps in the production process. Typically, DRAM devices are tested by using write and read operations to determine whether all of the cells of the memory array can properly store data signals and whether the stored data signals can be read out of the memory array. As memory chips become more dense, the testing time that is required to verify that data is being correctly stored and read out has increased dramatically.

In one test that is commonly used to identify faulty cells of a memory array, a signal having a logic level of either one or zero is applied to one group of the memory cells and signals of the opposite logic level are applied to the remaining cells. The logic level signals are then read out of the cells individually and tested for the correct logic levels. This test must be repeated for each of the cells in the memory array and the entire procedure is repeated with signals of the opposite logic levels.

Prior to my memory access cycle, both for normal operation of the memory and during testing of the memory, paired digit lines must be equilibrated to a common potential, typically one-half the supply voltage Vcc. Memory devices include equilibration circuits for this purpose. Typically, the equilibration circuit comprises one or more transistors that are connected between the digit lines that form a pair of paired digit lines. These transistors are enabled by an equilibrate enable signal that is provided prior to the start of a memory access cycle. When enabled, the transistors short the paired digit lines together. The equilibrating voltage is applied to these transistors which transfer the voltage to the interconnected digit lines.

Conventionally, the equilibrating voltage is applied to the transistors of the equilibration circuit through a "long" transistor which functions as a bleeder resistance in the case of a row-to-column short for the memory. However, the presence of this large resistance in the application path for the equilibrating voltage decreases the rate at which the digit lines can be equilibrated to the final generator voltage. Typically, digit line equilibration can take 40 to 50 microseconds, and as long as 100 microseconds, depending on what the final generator voltage is, for each memory row being tested. Consequently, testing an array of memory cells requires a substantial amount of time, and the time required to pre-charge the digit lines in each row significantly impacts the cost of testing of the memory device.

The time required for testing DRAM devices can be reduced by using a test procedure that is commonly referred to as "array hopping". In this procedure, digit line equilibration is initiated in a first portion of the array and, during equilibration of the first portion of the array, the test procedure is advanced to a second portion of the array in which the memory cells have already been equilibrated. The first portion of the array is tested after a time delay that is sufficient to achieve the digit line equilibration desired. Although "array hopping" provides a reduction in the total time required for testing of a semiconductor memory, typically only four "hops" are practical, thus limiting the test time reduction that can be achieved for testing the complete memory array.

For the reasons stated above, and for other reasons which will become apparent to those skilled in the art upon reading and understanding the present specification, there is a need in the art for a method and circuit for rapidly equilibrating paired digit lines of a semiconductor memory device, such as a random access memory device, during testing to minimize the time that is required for conducting the testing of the memory device.

SUMMARY OF THE INVENTION

The present invention provides a circuit fabricated in an integrated circuit memory device for equilibrating paired digit lines of a memory array of the memory device. The circuit includes pass circuitry interposed between the paired digit lines and a source of an equilibrating voltage for connecting the equilibrating voltage to the paired digit lines. The pass circuitry includes a plurality of pass gates disposed in at least one spare row of the memory array and coupled to a further word line for the one spare row of the memory array. A drive circuit produces a drive signal for activating the word line for the spare row, for enabling the pass gates to connect the equilibrating voltage to the paired digit lines.

In accordance with another aspect of the invention, there is provided an integrated circuit memory device including a memory array including a plurality of memory cells arranged to form a matrix of rows and columns, a plurality of row lines for accessing the memory cells and a plurality of paired digit lines coupled to the memory array. A test mode circuit is provided for operating the memory device in a test mode. The memory device includes conventional equilibration circuitry connected between first and second digit lines of at least one of the paired digit lines for applying an equilibrating voltage to the first and second digit lines and for equilibrating the potentials on the first and second digit lines. The memory device further includes pass circuitry connected between first and second digit lines and the source of the equilibration voltage, in parallel with the equilibration circuitry, for coupling the equilibration voltage directly to the digit lines. In one embodiment, the memory device includes a drive circuit for enabling the pass circuitry when the memory device is being operated in the test mode, for bypassing the conventional equilibration circuitry to rapidly equilibrate the digit lines to the equilibration voltage.

In accordance with a further aspect of the invention, there is provided a method for equilibrating paired digit lines of an integrated circuit memory device during the testing of the memory device. The method includes enabling the memory device to operate in a test mode, enabling equilibration circuitry for applying an equilibrating voltage to the paired digit lines during an equilibration cycle and for equilibrating the potentials on the digit lines of each digit line pair prior to the start of each memory access cycle, and providing a bypass path around at least a portion of the equilibration circuitry during at least a portion of the equilibration cycle for connecting the equilibrating voltage directly to digit lines of each digit line. In one embodiment, the bypass path is provided by enabling a plurality of pass gates prior to the start of a memory access cycle.

DESCRIPTION OF THE PREFERRED EMBODIMENT

In the following detailed description of the preferred embodiment, reference is made to the accompanying drawings which form a part hereof, and in which is shown by way of illustration a specific preferred embodiment in which the invention may be practiced. The preferred embodiment is described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1:
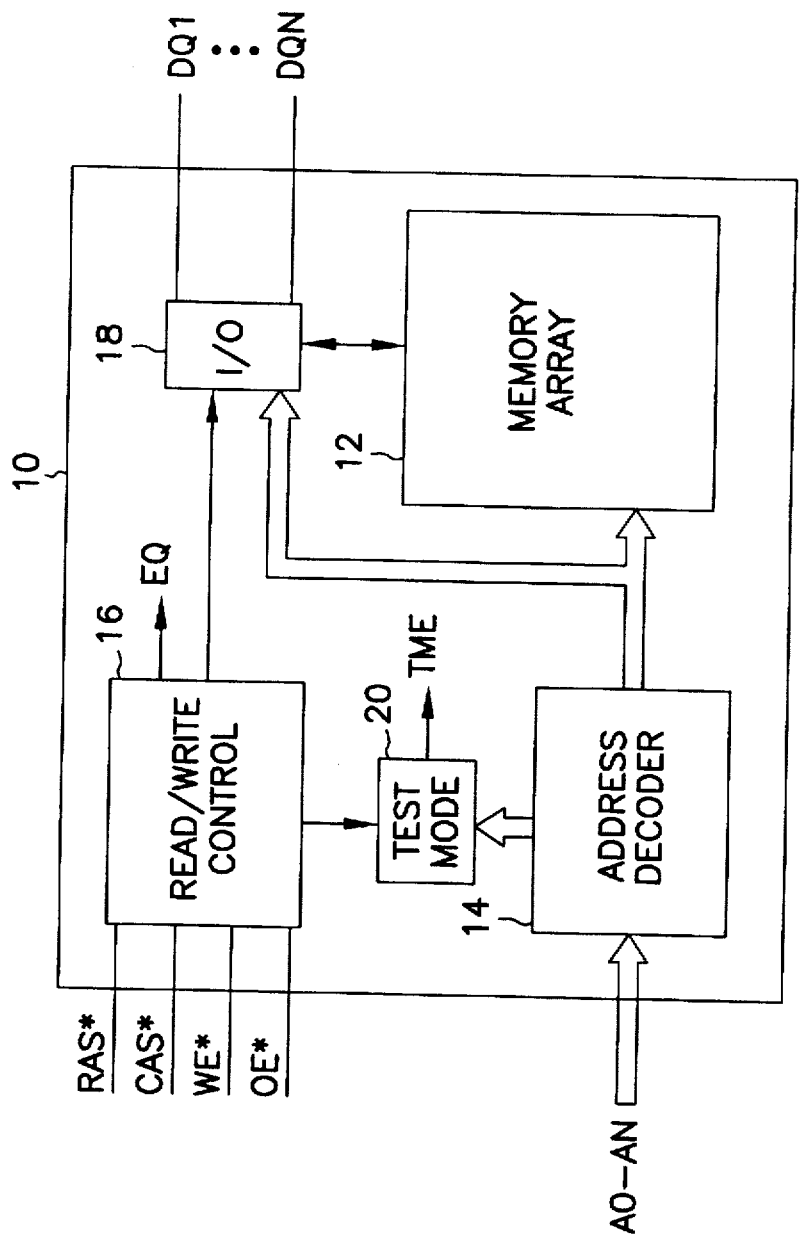
FIG. 1 is a simplified representation of a semiconductor memory device incorporating the invention.

FIG. 1 is a simplified representation of a semiconductor memory device 10 incorporating the invention. In the exemplary embodiment, the semiconductor memory device 10 is a dynamic random access memory (DRAM). However, the invention can be incorporated into other semiconductor memory devices. The basic memory device 10 is well known in the art to include a memory array 12, address decoder circuits 14, read/write control circuits 16 and input/output circuits 18. The memory device 10 additionally includes a test mode circuit 20 that is programmable to respond to coded addresses to produce test signals for enabling a plurality of tests to be conducted by the memory device during fabrication of the memory device, for example.

Figure 2:
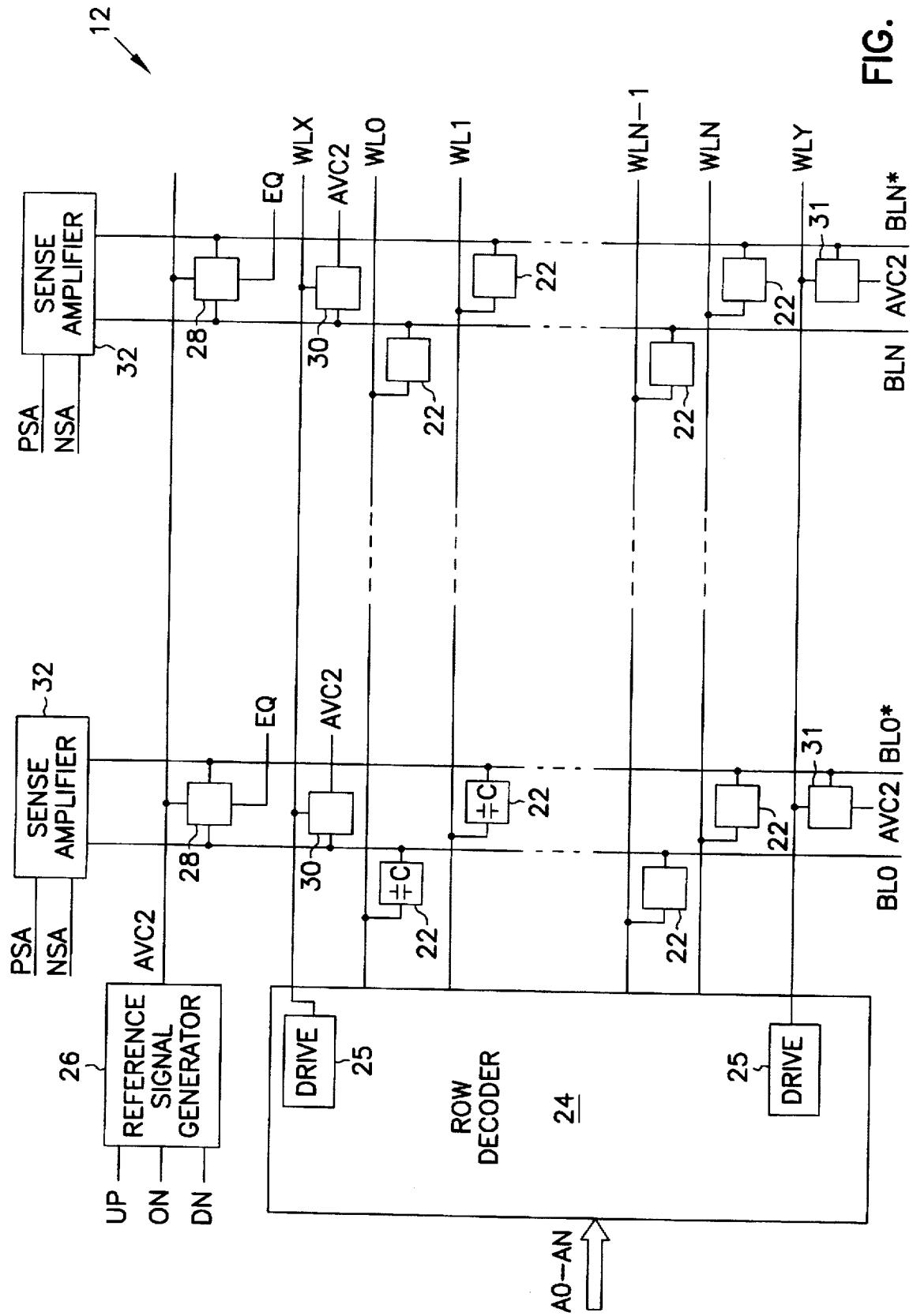
FIG. 2 is a simplified representation of the memory array and a portion of the memory array access circuitry for the memory device of FIG. 1 and illustrating the pass circuitry provided by the invention.

Referring additionally to FIG. 2, the memory array 12 is constructed of a plurality of memory cells 22 arranged in a matrix and having inputs and outputs corresponding to the rows and the columns of the matrix or array. In the example, the array has paired digit or bit (data) lines BL0, BL0* . . . BLN, BLN* and word (address) lines WL0, WL1 . . . WLN-1, WLN. The paired digit lines BL0, BL0* . . . BLN, BLN* are used to write information into the memory cell and to read data stored in the memory cell. Each of the paired digit lines includes a true state digit line, such as digit line BL0, and a complementary digit line, such as digit line BL0*. The word lines WL0, WL1 . . . WLN-1, WLN are used to address or select the memory cell to which data is to be written or read. The memory array 12 includes spare rows at opposite sides of the memory array which are addressable by row lines WLX and WLY.

The address decoder circuits 14 include row decoder circuits 24 which control word line drivers to access the memory cells of the memory array 12 in response to address signals A0–AN that are provided by an external controller (not shown), such as a standard microprocessor. The row decoder includes driver circuits 25 for activating the row lines WLX and WLY of the spare rows. Although shown as separate circuits, the driver circuits 25 can be a common circuit because in this application, the row lines WLX and WLY are activated by common signals and at the same time. The address decoder circuits 14 also include bit line drivers and column decoder circuits (not shown) for selecting the bit lines. The input/output control circuits 18 include a plurality of sense amplifiers 32 and other circuits which control either synchronous or asynchronous data communication between the memory device 10 and external devices in the conventional manner.

With continued reference to FIG. 2, the typical data sensing and transfer circuits are described. By way of example, the memory cells 22 of the DRAM device 10 can be formed as capacitors C which store data as a charge. A logic one is typically stored as a charge on the capacitor and a logic zero is typically stored as a discharged capacitor. Also, each memory cell 22 includes an n-channel access transistor (not shown) connected such that its source electrode is connected to the memory cell capacitor and its drain electrode is connected to one of the paired digit lines BL0 or BL0*. The access transistor is activated by raising its gate potential using one of the addressable row lines WL0–WLN.

A reference signal generating circuit 26 functions as a source of a pre-charge or equilibrating voltage AVC2 which is applied to the digit lines by equilibration circuits 28. A separate equilibration circuit 28 is provided for each of the paired digit lines, such as paired digit lines BL0 and BL0*, and is connected between the associated paired digit lines to equilibrate the potentials of paired digit lines to the precharge voltage AVC2 when equilibrate signal EQ is provided by read/write control 16. The sense amplifiers 32 are connected to each of the paired digit lines, such as BL0 and BL0*. The sense amplifiers 32 typically include n-sense and p-sense amplifier circuits, as is known to one skilled in the art.

Conventionally, to transfer data from a memory cell 22 during memory access cycle defined by a row access strobe RAS* signal, the equilibration circuit 28 is activated to couple the pre-charge voltage AVC2 to the digit lines associated with the memory cell. After the signal RAS* goes low, but before a row line fires, the equilibration circuit is deactivated. Next, for a memory read operation, a selected word line, such as word line WL0, is activated and the access transistor of the memory cell is turned on to connect the memory cell to its associated digit line, such as digit line BL0. The charge shared by the memory cell with the digit line will change the digit line potential by approximately ±200 millivolts. The differential between the paired digit lines BL0 and BL0* is then sensed using sense amplifiers.

For a memory write operation, the paired digit lines, such as digit lines BL0 and BL0*, are charged to represent the data to be written into the memory cell on a particular word line, such as word line WL0. The word line WL0 is activated for connecting the memory cell to the digit line BL0 to allow charge sharing between the digit line and the capacitor C of the memory cell.

In accordance with the invention, the reference signal generating circuit 26 is further coupled to the paired digit lines by activating a plurality of pass circuits which are located in the spare rows of the memory array. The pass circuits include a first plurality of pass gates 30 which are associated with the true digit lines, such as digit lines BL0 and BLN, and a second plurality of pass gates 31 which are associated with the complementary digit lines, such as digit lines BL0* and BLN*. The pass gates 30 are coupled to word line WLX and the pass gates 31 are coupled to word line WLY.

Figure 3:
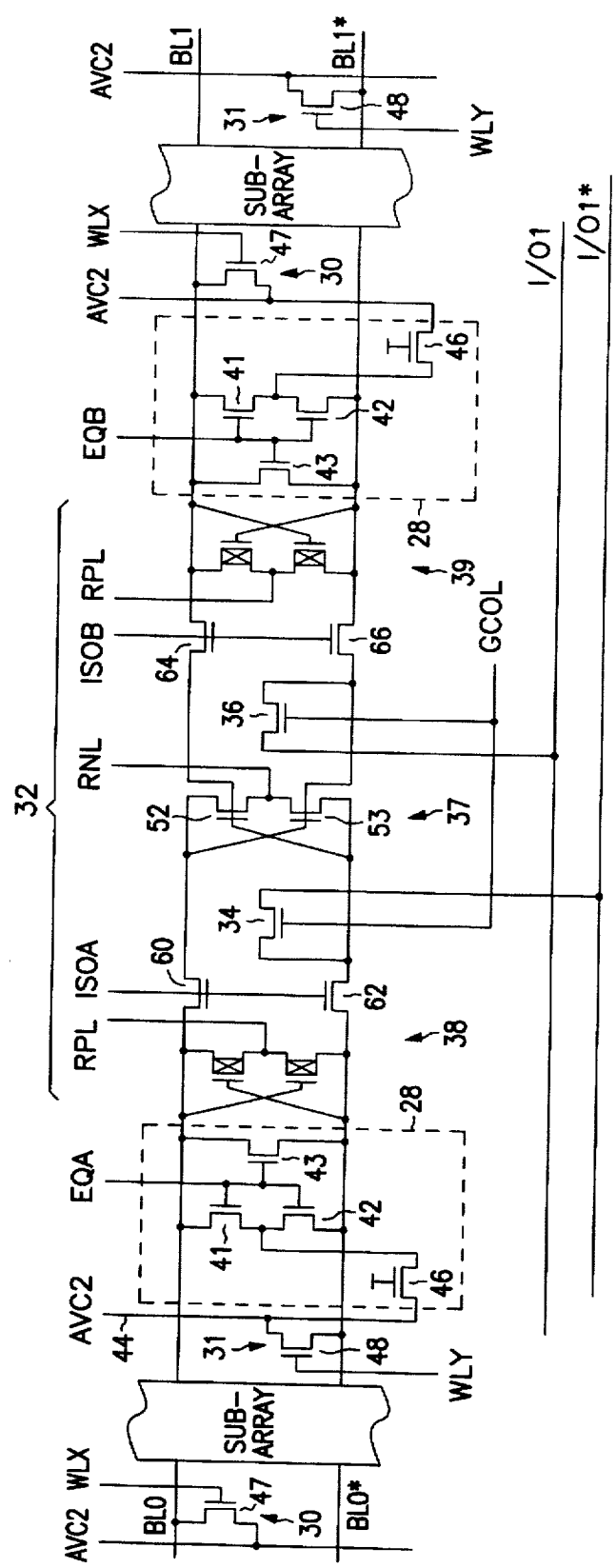
FIG. 3 is a schematic circuit diagram of a portion of the output circuits of the memory device of FIG. 1 and illustrating conventional equilibration circuitry and the pass circuitry provided by the invention.

Referring additionally to FIG. 3, there is illustrated a portion of the output circuits of the memory device for the memory cells of two subarrays 33A and 33B that are accessed using paired digit lines BL0 and BL0* and paired digit lines BL1 and BL1*. Associated with paired digit lines BL0 and BL0* are a conventional equilibration circuit 28, the pass gates 30 and 31 provided by the invention, a sense amplifier 32, and an input/output transistors 34 and 36 by which the paired digit lines BL0, BL0* and BL1, BL1* are coupled to the data input/output paths I/O1 and I/O1* of the memory device depending upon which of the isolation signals ISOA and ISOB is enabled.

Corresponding circuits are associated with the paired digit lines BL1 and BL1* and have been given the same reference numerals, except for the input/output transistor which has been given the reference numeral 36. Also, sense amplifier 32 includes an n-sense amplifier circuit 37 and a pair of p-sense amplifier circuits 38 and 39. The n-sense amplifier circuit 37 is common to both digit line pairs. P-sense amplifier 38 is associated with digit lines BL0 and BL0* and p-sense amplifier 39 is associated with digit lines BL1 and BL1*.

The conventional equilibration circuitry 28 includes n-channel transistors 41 and 42 which are connected in series between the complementary digit lines BL0 and BL0*, and a further n-channel transistor 43 that is connected between the complementary digit lines BL0 and BL0* and in parallel with transistors 41 and 42.

The gate electrodes of transistors 41, 42 and 43 are commonly connected to receive an equilibration enabling signal EQA that is produced by the read/write control circuits 16 (FIG. 1) in the conventional manner. It is pointed out that the read/write control circuits 16 produce separate equilibrating signals EQA and EQB, with signal EQA being applied to the equilibrating circuit associated with subarray 33A and the equilibrating signal EQB being applied to the equilibrating circuit associated with subarray 33B. The equilibrating voltage AVC2 that is produced by the reference signal generator 26 is applied to the AVC2 supply rail 44.

The AVC2 supply rail 44 is coupled to the junction of the drain electrodes of the transistors 41 and 42 through a "long" transistor 46. Transistor 46 functions as a current limiting device for limiting current flow in the event of a row-to-column short in the memory array, as is known in the art. The transistor 46 provides a resistance on the order of about 100K ohms. The transistor 46 has its gate electrode connected to the Vcc supply rail so that the transistor 46 is gated on whenever power is being applied to the memory device 10.

When the equilibration enabling signal EQA is provided, transistors 41, 42 and 43, associated with memory array 33A, are turned on to extend the equilibrating voltage AVC2 to the paired digit lines BL0 and BL0*. Transistor 43 shorts together the two digit lines BL0 mad BL0* while the equilibration enable signal EQA is being provided so that both digit lines are equilibrated to the voltage AVC2. When the equilibration signal is applied to digit lines, such as digit lines BL0 and BL0*, through the "long" transistor 46, it can take forty to fifty microseconds, and as long as 100 microseconds, for the two digit lines BL0 and BL0* to become equilibrated to the voltage AVC2, depending upon the level at which the voltage AVC2 is set, because of the relatively large resistance of the "long" transistor 46. The equilibration circuitry 28 associated with paired digit lines BL1 and BL1 * functions in a similar manner to extend the equilibrating voltage AVC2 to the digit lines BL1 and BL1* when equilibration signal EQB is provided.

The pass gates 30 and 31, provided by the invention, together function as a redundant, fast equilibration circuit that is activated when the integrated circuit device is being operated in the test mode. The pass gates 30 and 31 are formed by a pass transistor 47 and a pass transistor 48, respectively, which are located at separate ends of the subarray 33A. Transistor 47 is connected between a source of the equilibrating signal AVC2, such as the AVC2 supply rail 44, and one of the digit lines, such as digit line BL0, of the paired digit lines. The gate electrode of the transistor 47 is connected to word line WLX. Similarly, transistor 48 is connected between a source of the equilibrating signal AVC2, such as the AVC2 supply rail 44, and the other digit line BL0* of the paired digit lines. The gate electrode of the transistor 48 is connected to word line WLY. Thus, pass transistors 47 of pass gates 30 are associated with word line WLX and the true-state digit lines BL0–BLN, and the pass transistors 48 of pass gates 31 are associated with word line WLY and the complementary digit lines BL0*–BLN*. Similarly, pass gates 30 and 31 formed by a pass transistor 47 and a pass transistor 48, respectively, are located at separate ends of the subarray 33B. The n-sense amplifier circuit 37 is comprised of a pair of cross-coupled, n-channel transistors 52 and 53. The source electrodes of transistors 52 and 53 are connected to a common enable line RNL. The enable line RNL is typically held at one-half the supply voltage (Vcc) and is strobed low to sense data stored on a selected memory cell. Similarly, each p-sense amplifier circuit, such as sense amplifier circuit 38, is comprised of a pair of cross-coupled, p-channel transistors 56 and 57. The source electrodes of the p-channel transistors 56 and 57 are connected to a common enable line RPL which is normally held to Vcc/2 and is strobed high to sense data stored on the memory cells. Isolation transistors 60 and 62 are interposed between the n-sense amplifier circuit 37 and the p-sense amplifier circuit 38 and are enabled when signal ISOA is enabled. Similarly, isolation transistors 64 and 66 are interposed between the n-sense amplifier circuit 37 and the p-sense amplifier circuit 39 and are enabled when signal ISOB is enabled.

The input/output transistor 34 is connected between digit lines BL0* and BL1 and the data input/output path I/O1* for coupling the digit lines BL0* and BL1 to the data output path I/O1* of the memory device, digit line BL1 being coupled to transistor 34 through transistor 52 of sense amplifier 37. Similarly, the input/output transistor 36 is connected between digit lines BL0 and BL1* and the data input/output path I/O1 for coupling the digit lines BL0 and BL1* to the data input/output path I/O1 of the memory device, digit line BL0 being coupled to transistor 36 through transistor 53 of sense amplifier 37. The gate electrodes of transistors 34 and 36 are commonly connected to receive a column select signal GCOL produced by the address decoder circuits 14 (FIG. 1) for enabling the transistors 34 mad 36 to connect the digit line pairs to peripheral data path circuits of the memory device 10.

Figure 4:
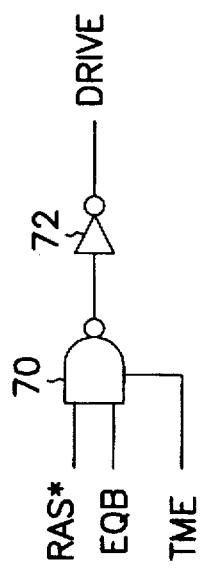
FIG. 4 illustrates a driver circuit for enabling the transistors that form the pass circuitry.

Referring to FIG. 4, the driver circuit 25 includes a NAND gate 70 and an inverter 72. The NAND gate 70 has a first input connected to receive the active low row access strobe (RAS*) signal and a second input connected to receive the equilibration enable signal EQA (or EQB). In addition, the NAND gate 70 receives a test mode enable signal (TME) which primes the NAND gate, allowing the NAND gate 70 to respond to the RAS* and EQA signals only when the memory device 10 is being operated in the test mode. The test mode enable signal TME can be produced by the test mode circuit 20 (FIG. 1) of the DRAM device 10 in the manner known in the art.

Figure 5:
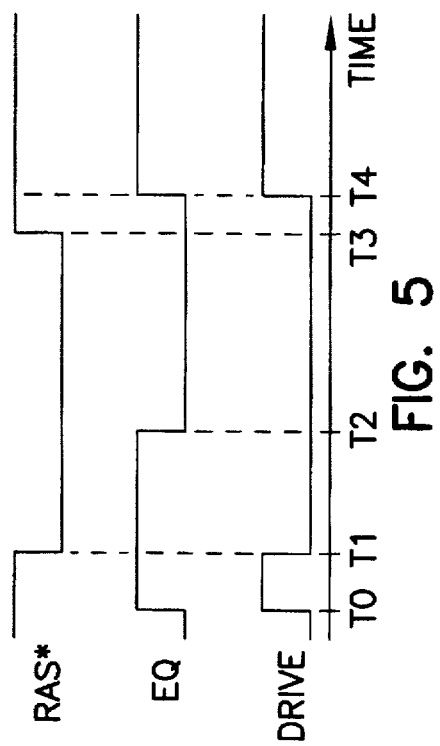
FIG. 5 is a timing diagram for the driver circuit of FIG. 4.

Referring additionally to the timing diagram given by FIG. 5, whenever NAND gate 70 is primed by the test mode enable signal TME, the driver circuit 25 is enabled to generate a drive signal DRIVE for activating the row lines WLX (and WLY) whenever the signal RAS* is high and the equilibration enable signal EQA is being provided. When signal RAS* becomes a logic low level, indicating that a memory access cycle is being initiated, the NAND gate 70 is disabled, terminating the drive signal. Also, because the equilibration enable signal EQA is set low during the memory access cycle, the NAND gate 70 cannot be reenabled when signal RAS* again becomes logic high, until the equilibration enable signal EQA again becomes a logic high level. This assures that the pass gates 30 and 31 are not activated during a memory access cycle, defined by the RAS* being in its low active state, or prior to the equilibration circuits 28 being activated which occurs after the signal RAS* becomes a logic high level. The driver circuit 25 does not require high power because it is only driving one row of transistors.

Figure 6:
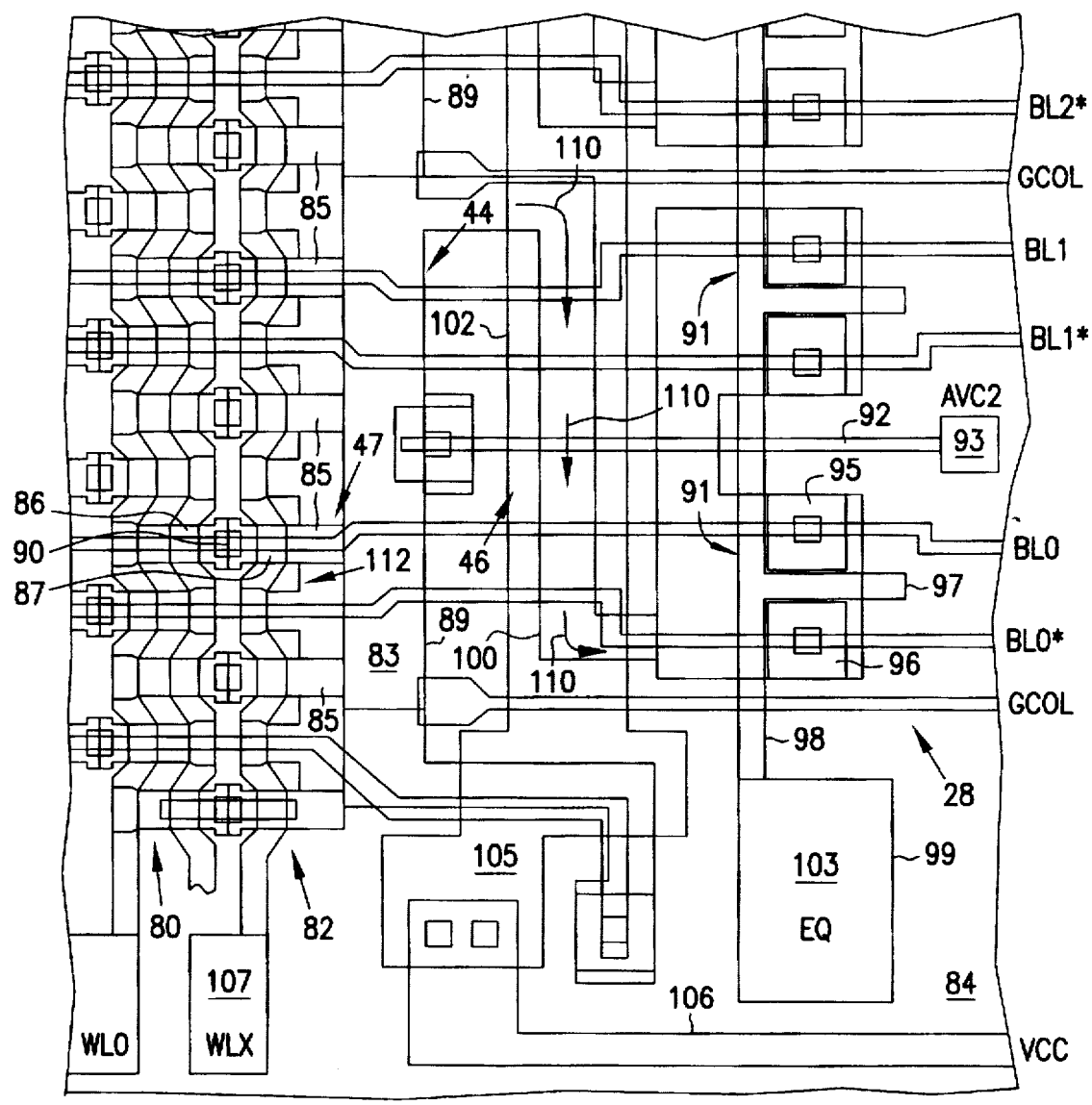
FIG. 6 is a simplified representation of the physical layout of a portion of the memory device of FIG. 1 and illustrating the conventional equilibration circuitry and the pass circuitry provided by the invention.

Referring now to FIG. 6, in accordance with another aspect of the invention, the pass transistors, such as pass transistors 47, comprise devices that are produced as part of the process of fabricating the memory device but which normally are not used in the basic memory device. That is, the pass transistors 47, and the pass transistors 48 (FIG. 3) are fabricated in spare rows of the memory array and are produced as the result of the pattern used to form access transistors of the memory cells being stepped out to the edge of the subarrays during fabrication of the memory array so as to provide a buffer area around the active elements of the memory array 12.

FIG. 6 illustrates the physical layout of a portion of the memory array 12 of the memory device of FIG. 1, including a portion of one row of memory elements of the memory array, indicated at 80, a portion of one of the spare rows, indicated at 82, which is provided at one side of the memory array, and the conventional equilibration circuitry indicated generally at 28.

The spare row 82, as fabricated in the integrated circuit device, contains a plurality of n-channel transistors which are formed in an n+ active area 83 that is provided on the substrate 84. In accordance with the invention, these n-channel transistors are used to provide the pass transistors 47 which are shown in FIG. 3. A further spare row (not shown) which is provided at the opposite side of the memory array, contains a further plurality of n-channel transistors which are used to provide the pass transistors 48. Row line WLX is formed by polysilicon material 107. In addition, spare columns (not shown) are provided at the top and bottom of the array as is known.

A portion of the n+active area 83, represented by the rectangular segments 89 which extend the length of the array along one side thereof, functions as the AVC2 source, or rail 44. This active area portion 83 is connected via metal conductors 92 to contacts 93 which are connected to the output of the reference signal generator 26 (FIG. 2). Preferably, the reference signal generator 26 is an on-chip circuit (not shown in FIG. 6) dedicated to producing the equilibration voltage AVC2, and with the output of the reference signal generator being extended to various locations on the chip by the AVC2 source 44. However, the equilibrating voltage AVC2 can be the voltage DVC2 that is used for cell-plate biasing, or the equilibrating voltage can be an externally generated signal that applied via an available contact pad, for example. Moreover, although the equilibrate voltage AVC2 has been described as being fixed at a predetermined value, the equilibrate voltage can be adjusted up or down using test vectors "UP" and "DN" applied to the signal generating circuit 26 (FIG. 2) and which can be activated using the test mode for the memory device as is known in the art. The reference signal generating circuit is enabled at power up by a signal "ON" in the manner known in the art.

As is illustrated, the AVC2 rail 44 abuts and is thus connected to the drain electrodes 85 of the pass transistors 47 in the spare row of the memory array. The source electrodes 86 of the pass transistors 47 are connected to the digit lines, such as digit line BL0*, using a contact connector, indicated generally at 90. The use of a contact connector in making a connection between a transistor and a metal conductor is well known in the art. The gate electrodes 87 of the pass transistors 47 are connected to the word line WLX. This word line WLX is terminated on one end by a contact 94 that is connected to the output of driver circuit 25 shown in FIG. 4.

The transistors 41, 42 and 43 of the equilibration circuitry 28 are indicated generally by the reference numeral 91. The transistors are connected to extensions portions 97 of the equilibrate rail 98 to receive the equilibration enable signal EQA that is applied to contact 99, formed by polysilicon material 103, which is connected to the output of the read/write control 16 (FIG. 1).

The "long" transistors 46 are formed in a further portion 100 of the n+ active area that extends between the AVC2 rail 44 and the active area 91, defining the source-drain region for the "long" transistors 46. The gate regions for the "long" transistors 46 are defined by polysilicon material 102 formed on the active areas and connected to the Vcc supply rail by a metal conductor, such as metal conductor 106, which connects to polysilicon material 105.

Thus, the normal path between the equilibrating voltage AVC2 and the equilibration transistors is indicated by the arrow 110. The rapid equilibrating path provided by the pass transistors 47 is indicated by the arrow 112.

The operation of the equilibration circuit will be described with reference to FIGS. 2–5. It is assumed that initially the memory device is being operated in the test mode so that the test mode enable signal TME provided by the test mode circuit 20 (FIG. 1) is in its true state. Accordingly, NAND gate 70 is enabled to respond to the signals RAS* and EQ, which represents signal EQA and EQB. At some time T0 before the active low signal RAS* becomes a logic low level, the read/write control circuit 16 (FIG. 1) generates the equilibration enable signal EQ (corresponding to either EQA and EQB). It is pointed out that the equilibration circuit 28 functions in the normal manner during the test mode and the equilibration transistors 41–43 are enabled to connect the equilibration voltage to the paired digit lines through the "long" transistor 46.

NAND gate 70 is enabled generating the signal DRIVE for activating the word lines WLX and WLY. Accordingly, transistors 47 and 48 are enabled, connecting the source of the equilibration signal AVC2 directly to respective digit line pairs, such as digit line pairs BL0 and BL0*, so that the paired digit lines are equilibrated immediately to the voltage AVC2. The pairs of digit lines are equilibrated at AVC2. Transistors 41, 42 and 43 also are enabled by the equilibration enable signal EQ for coupling the source of the equilibration voltage AVC2 to the digit lines, such as digit lines BL0 and BL0* for example, through the long transistor 46.

When signal RAS* becomes a logic low level, at a time T1, NAND gate 70 is disabled, disabling transistors 47 and 48. However, transistors 41–43 remain enabled until the equilibration enable signal becomes a logic low level, prior to the read or write operation. The paired digit lines maintain the precharge applied by the pass transistors 47 and 48 when the pass transistors are disabled. The equilibration transistors 41–43 are disabled when the equilibration enable signal EQ becomes logic low level at a time T2.

The signal RAS* again becomes a logic high level a time T3 at the end of the read/write cycle. However, NAND gate 70 cannot be reenabled until the equilibrate enable signal EQ again becomes a logic high level at a time T4.

Thus, it has been shown that the invention provides an arrangement for rapidly equilibrating the paired digit lines of the memory array of a semiconductor memory device, such as a dynamic random access memory device, during testing of the memory device. The rapid equilibration is provided by bypassing the conventional equilibration circuitry, using pass transistors to connect the equilibrating voltage directly to the paired digit lines. The pass transistors that are used to provide the fast equilibration function are located in spare rows of the memory array and are fabricated as part of the memory device. Thus, minimum additional circuitry is required to provide the rapid equilibration function. The pass transistors are enabled by activating the row lines for the spare rows when the memory device is being operated in a test mode.

What is claimed is:

1. A circuit fabricated in an integrated circuit memory device for equilibrating paired digit lines of a memory array of the memory device, wherein the memory array includes a plurality of memory cells arranged to form a matrix of rows and columns, and a plurality of row lines for accessing said memory cells, said circuit comprising:

pass circuitry interposed between the paired digit lines and a source of an equilibrating voltage for connecting the equilibrating voltage to the paired digit lines, said pass circuitry including a plurality of pass gates contained in at least one spare row of the memory array and coupled to a further row line for said one spare row of the memory array; and a drive circuit for producing a drive signal for at least said further row line for enabling said pass gates coupled to said further row line to connect the equilibrating voltage to said paired digit lines.

2. The circuit according to claim 1, wherein each of said pass gates comprises a field-effect transistor having a control electrode connected to said further row line, and a source-to-drain circuit interposed between one of said digit lines and the source of the equilibrating voltage, and said transistors being enabled in response to said drive signal to couple the equilibrating voltage to said one digit line.

3. The circuit according to claim 2, wherein said memory device includes a test mode enable circuit for providing a test mode enable signal for operating the memory device in a test mode, and wherein said drive circuit is enabled to provide said drive signal only when said test mode enable signal is being provided.

4. The circuit according to claim 1, wherein said memory array includes at least first and second spare rows, and wherein said pass circuitry includes a first plurality of pass gates contained in said first spare row and being individually associated with true state digit lines of said paired digit lines, and a second plurality of pass gates contained in said second spare row and being individually associated with complementary digit lines of said paired digit lines.

5. An integrated circuit memory device comprising:

a memory array including a plurality of memory cells arranged to form a matrix of rows and columns, a plurality of row lines for accessing said memory cells, said memory array including a plurality of spare rows and row lines for accessing said spare rows;

a plurality of paired digit lines coupled to said memory array;

a test mode circuit for causing the memory device to be operated in a test mode;

a source of an equilibrating voltage;

equilibration circuitry connected between first and second digit lines of at least one of said paired digit lines for applying the equilibrating voltage to said first and second digit lines and for equilibrating the potentials on said first and second digit lines; and pass circuitry contained in at least one of said spare rows, said pass circuitry being interposed between said first and second digit lines and said source of the equilibrating voltage, and in parallel with said equilibration circuitry, for connecting the equilibrating voltage directly at least to said first and second digit lines when the memory device is being operated in the test mode.

6. The memory device according to claim 5, wherein said pass circuitry includes a plurality of pass gates, each of said pass gates being individually associated with a different one of said digit lines, and a drive circuit for enabling said pass gates.

7. The memory device according to claim 6, wherein each of said pass gates comprises a field-effect transistor having a source-to-drain circuit interposed between its associated digit line and said source of the equilibrating voltage, and a gate electrode connected to the row line for said one spare row.

8. The memory device according to claim 6, wherein said equilibration circuitry includes a plurality of equilibration transistors for applying the equilibrating voltage to the paired digit lines, and at least one high resistance pass gate interposed between the equilibration transistors and the source of the equilibrating voltage for extending the equilibrating voltage to the equilibration transistor, said pass gates providing a bypass path around at least said high resistance pass gate whenever said pass circuitry is enabled.

9. The memory device according to claim 6, wherein said drive circuit is disabled by a timing signal that defines an access cycle for said memory array, and said drive circuit is enabled, in the absence of said timing signal, in response to an equilibration enable signal that is provided for enabling said equilibration circuitry.

10. An integrated circuit memory device comprising:

a memory array having a plurality memory cells;

a plurality of paired digit lines coupled to the memory array;

a controller for defining memory access cycles;

a test mode circuit for causing the memory device to be operated in a test mode;

a source of an equilibrating voltage;

equilibration circuitry connected to the plurality of memory cells for coupling the equilibrating voltage to the digit lines during equilibration cycles for equilibrating the digit lines of each pair to the equilibrating voltage;

pass circuitry interposed between the source of the equilibrating voltage and the plurality of digit lines; and a drive circuit for enabling said pass circuitry to connect the equilibrating voltage directly to the plurality of digit lines during the equilibration cycles only when the memory device is being operated in the test mode.

11. The memory device according to claim 10, wherein said drive circuit enables said pass circuitry at the start of each equilibration cycle, and disables said pass circuitry at the start of each memory access cycle.

12. The memory device according to claim 10, wherein said equilibration circuitry includes a plurality of equilibration transistors and at least one current limiting device for coupling the equilibrating voltage to said equilibrating transistors, said pass gates providing a bypass path to the digit lines around at least said one current limiting device.

13. The memory device according to claim 10, wherein said memory array includes a plurality of spare rows, and wherein said plurality of pass gates are contained in at least one of said spare rows of said memory array.

14. A method for equilibrating paired digit lines of an integrated circuit memory device during the testing of the memory device, the memory device including an array of memory cells arranged in plurality of rows and columns, and a plurality of row lines for accessing the memory cells, said method comprising:

enabling the memory device to operate in a test mode;

enabling equilibration circuitry for applying an equilibrating voltage to the paired digit lines during an equilibration cycle, and for equilibrating the potentials on the digit lines of each digit line pair prior to the start of each memory access cycle; and providing a bypass path around at least a portion of the equilibration circuitry during at least a portion of the equilibration cycle to connect the equilibrating voltage directly to the digit lines of each digit line pair.

15. The method according to claim 14, wherein providing a bypass path around at least a portion of the equilibration circuitry includes enabling a plurality of pass gates at the start of each equilibration cycle to connect the equilibrating voltage directly to digit lines that form each pair of the paired digit lines.

16. The method according to claim 15, including disabling the pass gates prior to the start of a memory access cycle, and preventing the pass gates from being enabled unless the memory device is being operated in the test mode.

17. The method according to claim 15, wherein said plurality of pass gates are located in at least one spare row of the memory array, and wherein enabling the plurality of pass gates includes activating a row line for said at least one spare row of the memory array.

* * * * *

UNITED STATES PATENT AND TRADEMARK OFFICE
CERTIFICATE OF CORRECTION

PATENT NO. : 5,732,033
DATED : March 24, 1998
INVENTOR(S) : Patrick J. Mullarkey and Casey R. Kurth It is certified that error appears in the above-indentified patent and that said Letters Patent is hereby corrected as shown below:

Column 1, Line 33, delete "my", insert -- any --;
Column 6, Line 60, delete "mad", insert -- and --; and
Column 6, Line 27, Start a new paragraph with the word "The n-sense amplifer..."

Signed and Sealed this

Fourteenth Day of July, 1998

*Attest:*

BRUCE LEHMAN

*Attesting Officer*           *Commissioner of Patents and Trademarks*